United States Patent
Fan et al.

(10) Patent No.: US 7,038,433 B2
(45) Date of Patent: May 2, 2006

(54) ACTIVE ORING CONTROLLER FOR REDUNDANT POWER SYSTEMS

(75) Inventors: Weidong Fan, Torrance, CA (US); Goran Stojcic, Redondo Beach, CA (US); Daniel Yum, Poway, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/919,035

(22) Filed: Aug. 16, 2004

(65) Prior Publication Data

US 2005/0127979 A1   Jun. 16, 2005

Related U.S. Application Data

(60) Provisional application No. 60/509,448, filed on Oct. 8, 2003, provisional application No. 60/496,284, filed on Aug. 19, 2003.

(51) Int. Cl.
*G05F 1/40*  (2006.01)

(52) U.S. Cl. .................................................... 323/274

(58) Field of Classification Search ................ 323/265, 323/266, 268, 269, 271–275, 279, 282, 284, 323/285; 327/389, 392, 403, 404, 427, 434
See application file for complete search history.

(56) References Cited

U.S. PATENT DOCUMENTS

| | | | |
|---|---|---|---|
| 6,301,133 B1 * | 10/2001 | Cuadra et al. | 363/65 |
| 6,462,926 B1 * | 10/2002 | Zaretsky et al. | 361/103 |
| 6,894,468 B1 * | 5/2005 | Bretz et al. | 323/274 |

\* cited by examiner

*Primary Examiner*—Matthew V. Nguyen
(74) *Attorney, Agent, or Firm*—Ostrolenk, Faber, Gerb & Soffen, LLP

(57) ABSTRACT

ORing diodes are used for power redundancy. In order to reduce the power loss due to the diode forward drop voltage, active ORing power MOSFETs are proposed to replace the diodes. With the active ORing controller and power MOSFETs, the power loss can be easily decreased by 90%. To make an N-channel MOSFET work like a diode when it is in reverse and have a very small forward voltage drop when it is in forward, an ORing controller is provided. Its offset, hysteresis, and propagation delay times are optimized for speed, stability, and noise immunity. Its ORing function is tested in an ORing demo board. Its FET check feature makes a live checkup of the ORing power MOSFETs to improve the reliability of the redundant power system.

20 Claims, 6 Drawing Sheets

Offset and hysteresis voltages for the comparator

Function block diagram of an
ORing controller (IR5001)

ORing demo board and its schematic

ACTIVE ORING CONTROLLER FOR REDUNDANT POWER SYSTEMS

CROSS-REFERENCE TO RELATED APPLICATIONS

This disclosure is based upon and claims priority of Ser. No. 60/496,284 filed Aug. 19, 2003 (IR-2566 PROV) and Ser. No. 60/509,448 filed Oct. 8, 2003 (IR-2595 PROV), both incorporated by reference.

BACKGROUND OF THE INVENTION

1. Field of the Invention

The invention relates to a controller/driver for enabling a power MOSFET to be used for active ORing in redundant power systems. It relates more particularly to a controller/driver having a diagnostic feature for actively testing the condition of the power MOSFET.

2. Related Art

Power system redundancy is traditionally accomplished by combining two or more power sources into one redundant bus using diodes (commonly known as ORing diodes). ORing diodes are necessary to keep the common bus voltage present in case one of the OR-ed power sources fails short.

There are several typical applications of diode ORing. One is ORing of feed A and feed B sources in −48V carrier-class telecom systems, as shown in FIG. 1. Two input sources A and B are connected together through two diodes, which are connected to the negative sides of the sources. Another is ORing of N+1 redundant AC-DC rectifiers, which generate 48V or 24V to power various networking, telecom, high-end computing, or storage equipment. Lastly, high current low voltage outputs are often ORed together to provide redundant power for networking and computing processors.

When output power is low, diode ORing is a simple and low cost solution that provides quick and effective fault isolation. However, the best Schottky diodes on the market today used as ORing diodes often result in excessive power dissipation with high output power, requiring use of large packages and/or heat sinks. For example, the power level per system board in the proposed Advanced TCA spec is 200 W. The power dissipation due to diode ORing in this case can be as much as 3 W, or 1.5% of efficiency loss (for a standard 100V Schottky diode) at the worst-case input voltage (40.5V). Another problem with diode ORing is that it is not simple to detect potential diode short-circuit failure, which could result in loss of power redundancy.

SUMMARY OF THE INVENTION

To greatly reduce ORing diode power loss, it is possible to use a power MOSFET instead of a diode as a synchronous rectifier. Table 1 shows power loss for two Schottky diodes and for the IRF7495 power MOSFET when used in active ORing. The forward voltage drop for a MOSFET can be easily an order of magnitude lower than that of the best Schottky diode, reducing the power loss by 90%. However, in order to use power MOSFETs in ORing circuits, a controller is needed to drive the MOSFET, and to determine when to turn it on and when to turn it off so that the power MOSFET will work like a diode when it is in reverse and will have a very small forward voltage drop when it is in forward.

In order to meet the foregoing requirements for an active ORing controller for a power MOSFET, a novel integrated ORing controller (IR5001) has been developed. The controller in addition has a diagnostic function for actively testing the condition of the MOSFET.

According to an aspect of the invention, an active ORing controller for controlling a power MOSFET in a redundant power system comprises a comparator circuit for detecting a voltage difference across first and second main terminals of a power MOSFET, and comparing that voltage difference against a first predetermined level; and a control circuit which receives an output of the comparator circuit and outputs a control signal to be applied to a gate terminal of the power MOSFET. The control signal has a value such that the power MOSFET is turned OFF in response to the voltage difference falling below the predetermined level, and is turned ON at other times. The predetermined level is defined by two threshold voltages with positive and negative polarities, respectively. Preferably the negative threshold voltage is smaller in absolute value than the positive threshold voltage. Advantageously the control circuit turns the power MOSFET ON and OFF with unequal turn-on delay and turn-off delay times, the turn-on delay being preferably greater than the turn-off delay.

According to another aspect of the invention, the controller also comprises a check circuit for checking the condition of the power MOSFET, the check circuit being operable for setting the control signal to turn the power MOSFET OFF; and a sense circuit for detecting whether the above-mentioned voltage difference is lower than a second predetermined level, and if so, giving an indication that said power MOSFET is defective. The sense circuit advantageously comprises a comparator, a MOSFET and an LED; and the comparator controls the MOSFET to extinguish the LED when the voltage difference is lower than the second predetermined level, and to illuminate the LED at other times.

According to yet another aspect of the invention, an integrated active ORing controller, for controlling a power MOSFET in a redundant power system, comprises a package, circuits within the package and terminals extending out of the package. The controller comprises a comparator circuit having a pair of voltage inputs INN, INP for receiving and detecting a voltage difference across first and second main terminals of a power MOSFET, respectively, and comparing the voltage difference against a first predetermined level; and a control circuit which receives an output of the comparator circuit and outputs a control signal at a voltage output terminal Vout to be applied to a gate terminal of said power MOSFET. The control signal has a value such that the power MOSFET is turned OFF in response to the voltage difference falling below the predetermined level, and is turned ON at other times. The integrated controller may further comprise a check circuit which is operable for receiving a check signal on a terminal FETck, and in response thereto, setting the control signal to turn the power MOSFET OFF; and a sense circuit for detecting whether the voltage difference is lower than a second predetermined level, and if so, giving an indication at a status terminal FETst that the power MOSFET is defective.

These and other features and advantages of the present invention will become apparent from the following description of an embodiment of the invention, which refers to the accompanying drawings.

DESCRIPTION OF EMBODIMENTS OF THE INVENTION

Discrete Implementation of Active ORing Controller

Figure 1:
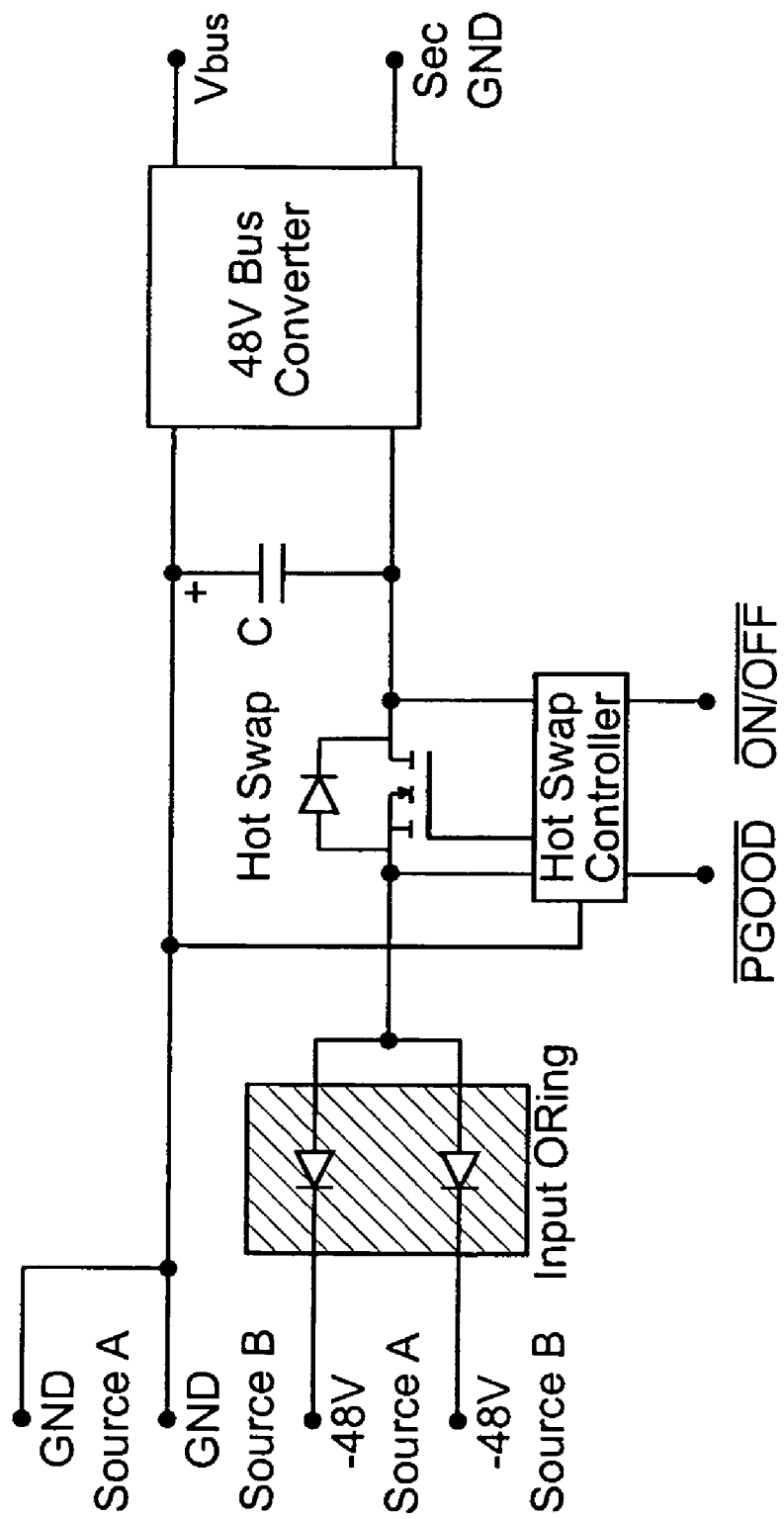
FIG. 1 is a block diagram of a conventional redundant power system including ORing diodes.
Figure 2:
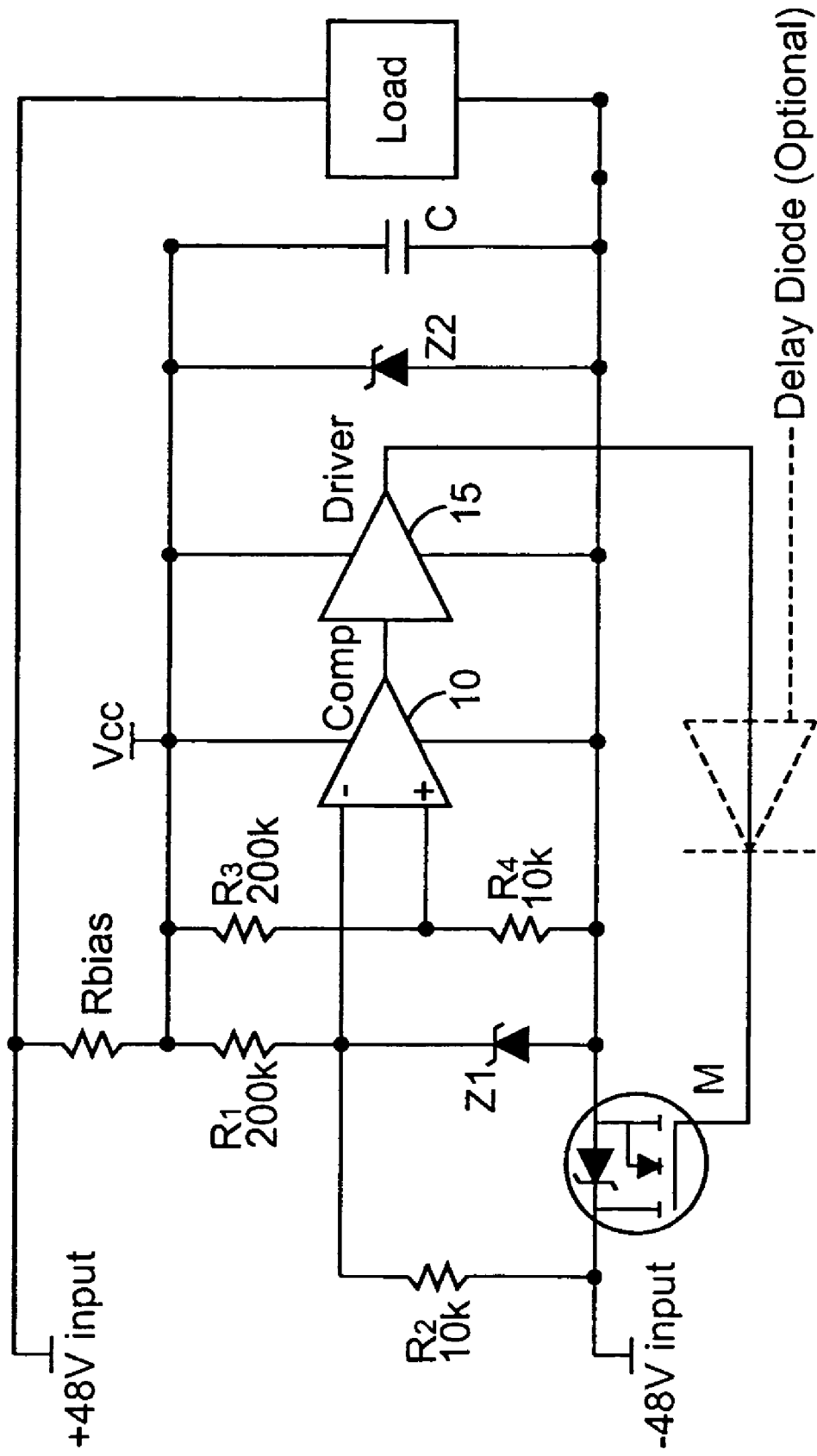
FIG. 2 is a schematic diagram of a discrete implementation of an active controller/driver for an ORing power MOSFET.

The main ORing control function can be realized discretely by using a comparator 10 and a driver 15, as shown in FIG. 2. Parameters for the comparator and the driver are selected for stable operation of the active ORing MOSFET M and so that it will function like a diode.

The four resistors R1–R4 have two functions. One is to form a level shift circuit so that the two input voltages for the comparator are within its specs. The resistance variation is small so that it does not introduce an additional offset voltage. For example, with 0.1% accuracy and 12V at Vcc, the worst case gives an offset of 2.3 mV, which has to be considered. The other function is to limit the input current and voltage to the comparator with R1 and Z1. This only occurs when the input source is short and brings the negative input to the positive 48V. A resistor Rbias sets a bias level.

Figure 3:
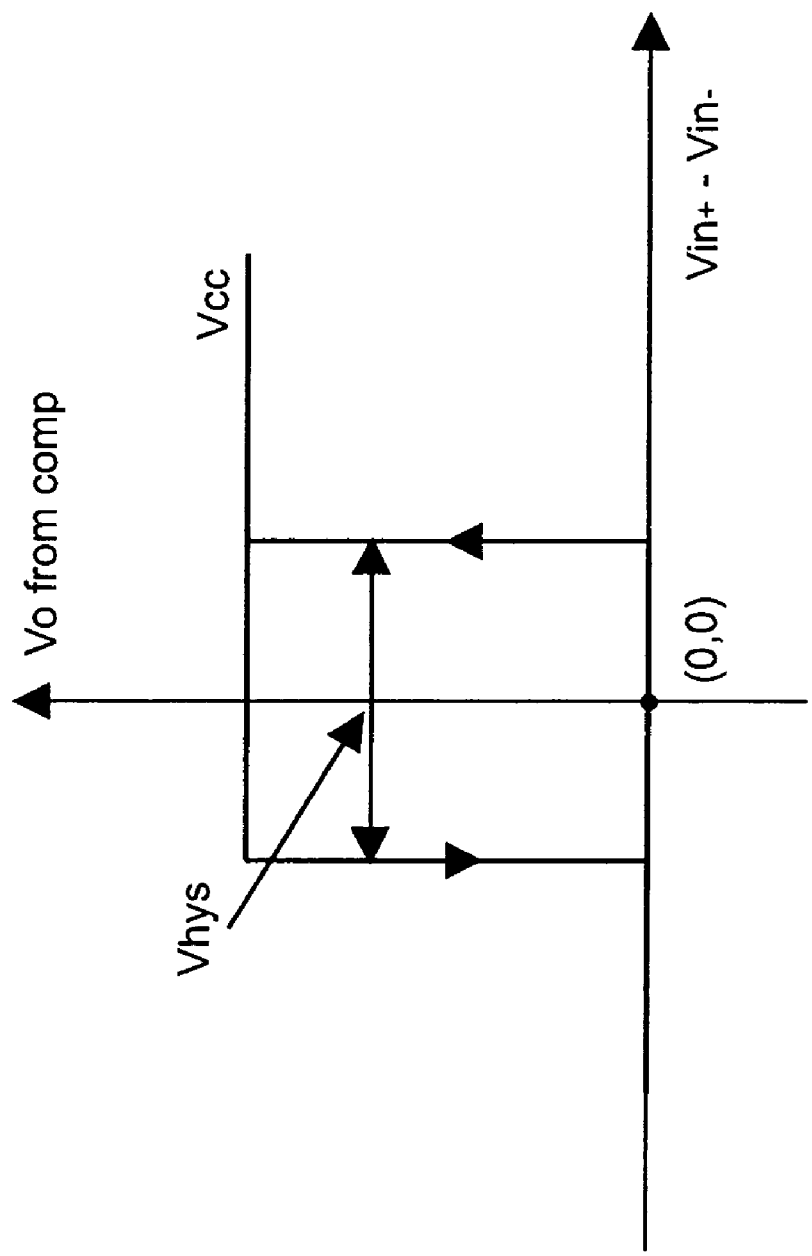
FIG. 3 shows offset and hysteresis voltages for the comparator in FIG. 2.

The comparator hysteresis voltage is high enough, compared with its offset voltage, so that the comparator has two input threshold voltages with different polarities, as shown in FIG. 3. For example, one is positive, and the other is negative. If both threshold voltages are on the negative side, the MOSFET will be turned on when the input voltage $(V_{in+}-V_{in-})$ of the comparator is lower than zero, so the MOSFET may be turned on when there is some reverse current through the MOSFET. Since the $R_{DSon}$ of the MOSFET can be very small, the reverse current can be significant, which is not allowed. Also, if both threshold voltages are on the positive side, the MOSFET may be off when the input voltage $(V_{in+}-V_{in-})$ is positive, so that the MOSFET may be off when it has a positive current. This will cause a steady state oscillation. This occurs because when the MOSFET is on, its Vsd voltage may be very small, so that it cannot be kept on, and will be turned off. After it is turned off, its Vsd voltage will increase to about 0.7V, which is definitely sufficient for the MOSFET to be turned on again. Therefore, the two threshold voltages have different polarities to prevent the active ORing circuit from having steady state oscillation.

The negative threshold voltage has to be small due to the reverse current. The reverse current allowed through the MOSFET equals the negative threshold voltage divided by the Rdson of the MOSFET. To make a MOSFET function like a diode when it is in reverse, the negative threshold voltage has to be small. Usually, it is less than 10 mV.

Figure 4:
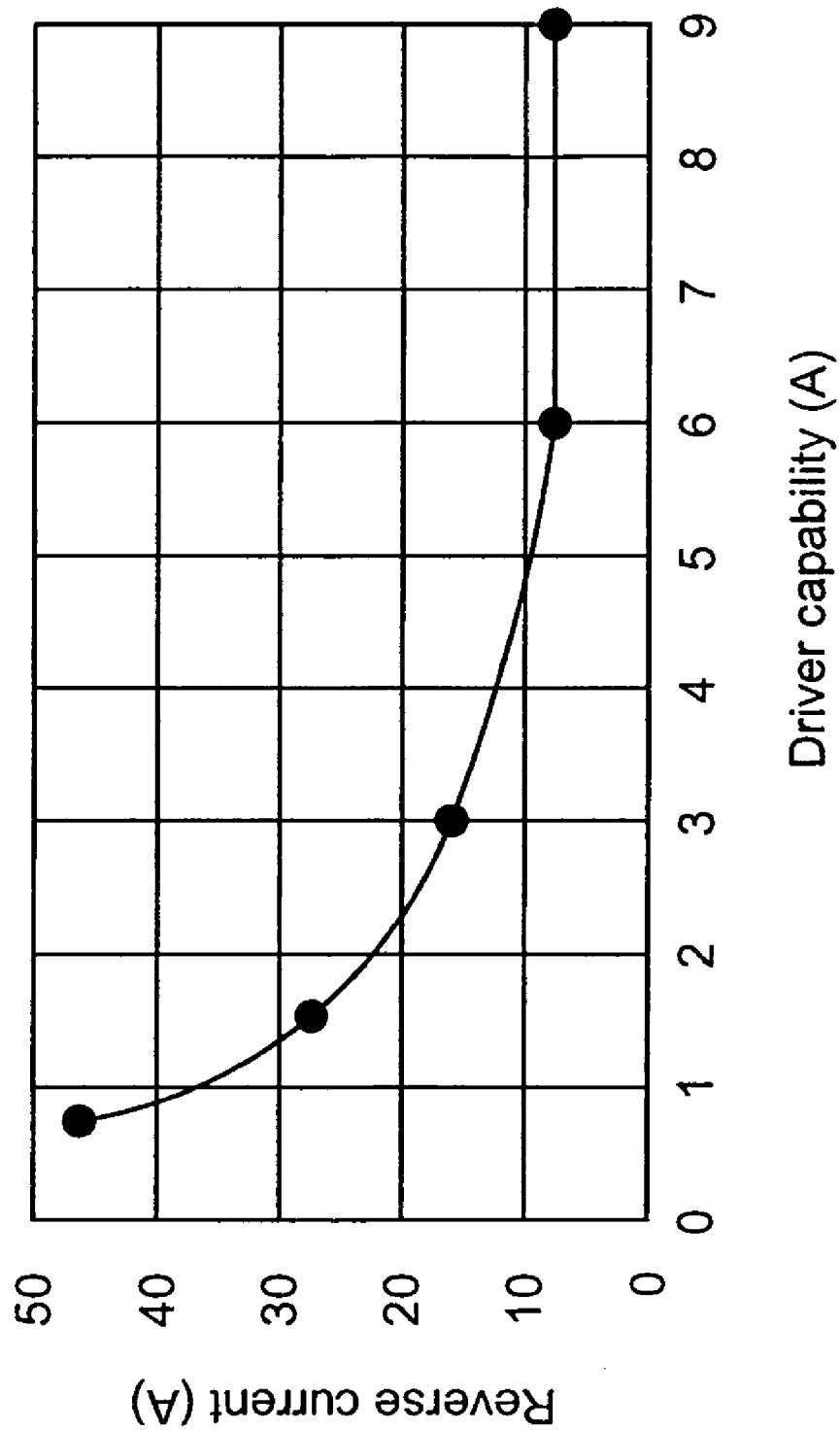
FIG. 4 shows reverse current versus driver capability in the circuit of FIG. 2.

In order to turn off the MOSFET fast, the total turn-off propagation delay and turn-off time have to be small. When there is a short of one input source, which creates some reverse current to trigger the turn-off of the MOSFET, a turn-off delay time is needed to send the logic signal to turn-off the MOSFET. During the delay, the MOSFET is kept on and the reverse current keeps increasing, and bus voltage keeps dropping. FIG. 4 shows how the reverse current depends on the driver's capability. When the driver's capability is over 3 A, the reverse current does not change very much. With a 9 A driver and 7 ns comparator, it takes only 55 ns between the short and turn-off of the MOSFET. And the reverse current is 6 A with less than 3V bus voltage change. However, if the time increases from 55 ns to 700 ns, 104 A reverse current is observed with 6V bus voltage drop. Therefore, turn-off propagation delay and turn-off time have to be small to guarantee the small reverse current and the small bus voltage drop.

Fast turn-on and turn-off of the active ORing MOSFET may make the circuit dynamically unstable. The active ORing circuit is right in front of a switching DC-DC converter. Switching noise will be picked up and present at the inputs of the comparator. If the magnitude of the switching noise is higher than the hysteresis voltage of the comparator, and the comparator and the driver are fast, the active ORing MOSFET will be turned on and off by the switching noise to cause oscillation for the active ORing circuit. To fix this, a long delay to turn on the active ORing is desirable. In other words, the turn-on and turn-off delay is very asymmetrical. Since drivers generally have similar driver capabilities in terms of turn-on and turn-off, one or more additional diode can be added between the driver and gate of the ORing MOSFET, as shown in phantom in FIG. 2, to get the asymmetrical drive times needed.

The requirements for the foregoing discrete active ORing circuit, regarding offset voltages, hysteresis, turn-on and turn-off propagation delay times, and turn-on and turn-off times, make the selection of the comparator and driver very limited.

Moreover, in order to detect a short of the active ORing MOSFET, an additional circuit (not shown in FIG. 2) has to be added. The additional circuit has to turn-off the active ORing MOSFET, and measure the drain-to-source voltage change. If the drain-to-source voltage of the MOSFET is very small when it is off and if there is some current passing through, the MOSFET can be identified to be bad. This circuit implementation would need at least one more comparator and other logic gates.

Active ORing Controller IC (IR5001)

Therefore, in order to meet the foregoing requirements for the active ORing controller using a MOSFET, a novel integrated ORing controller (IR5001) has been developed.

The controller 30 (FIG. 5) fits in a small SO8 package and requires only a small bias capacitor (FIG. 6) for proper operation. Its offset and hysteresis voltages, propagation delay, as well as gate drive capability allow fast fault protection and eliminate any possibilities for oscillation. An FET Check function is incorporated to provide a live checkup for the active ORing MOSFETs so that the system redundancy is maintained over the life of the equipment. This is an important and unique feature, which is not available in today's systems.

Figure 5:
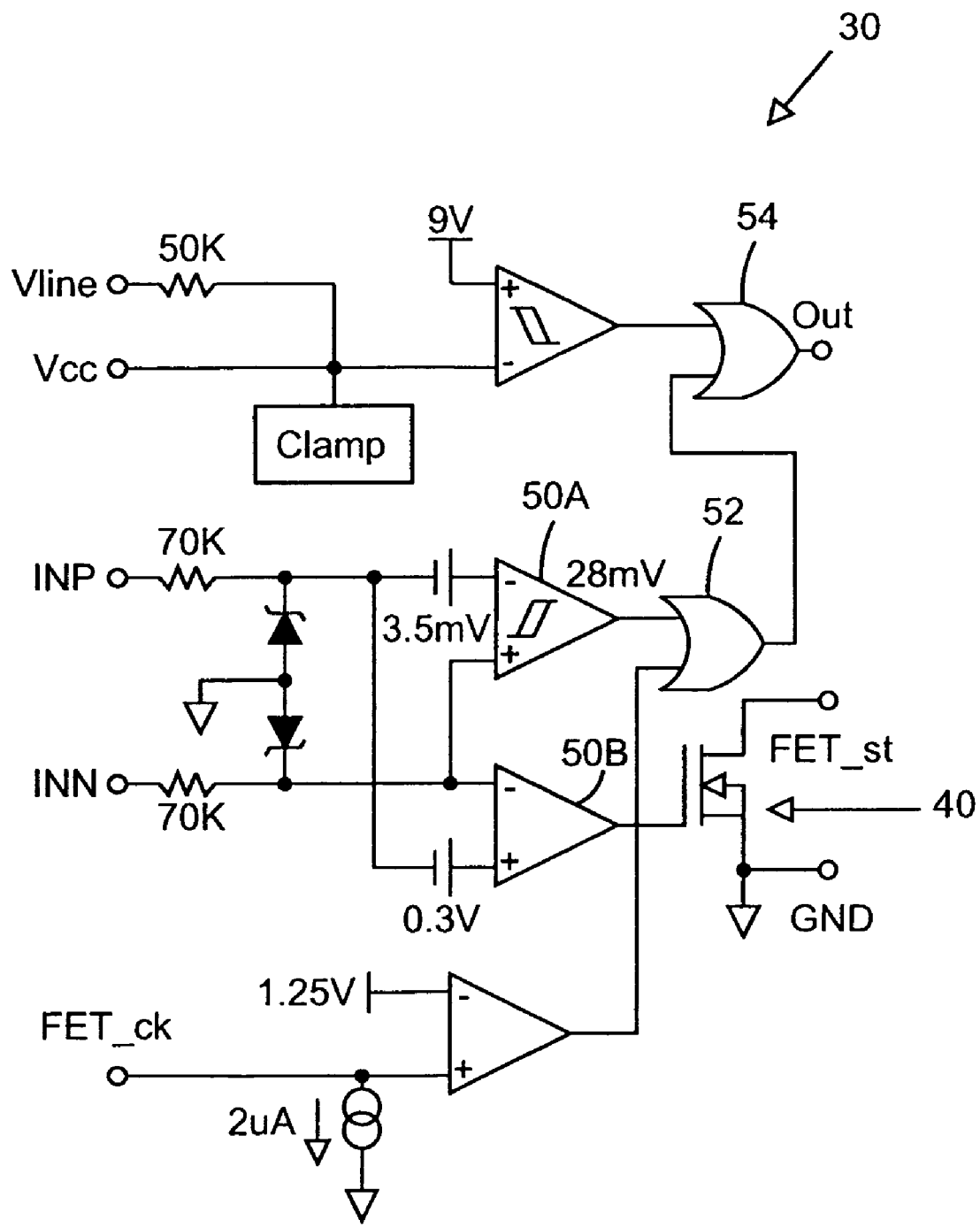
FIG. 5 is a block diagram of an integrated active ORing controller.

FIG. 5 shows a function block diagram of the active controller (IR5001). The main function of the controller 30 is to set the output low at the terminal OUT when a voltage across the voltage inputs INP, INN $(V_{in+}-V_{in-})$ is lower than several −mV, and to set the output voltage higher when the input voltage $(V_{in+}-V_{in-})$ is over several tens of mV, by a comparator 50A and a pair of OR gates 52, 54.

Figure 6:
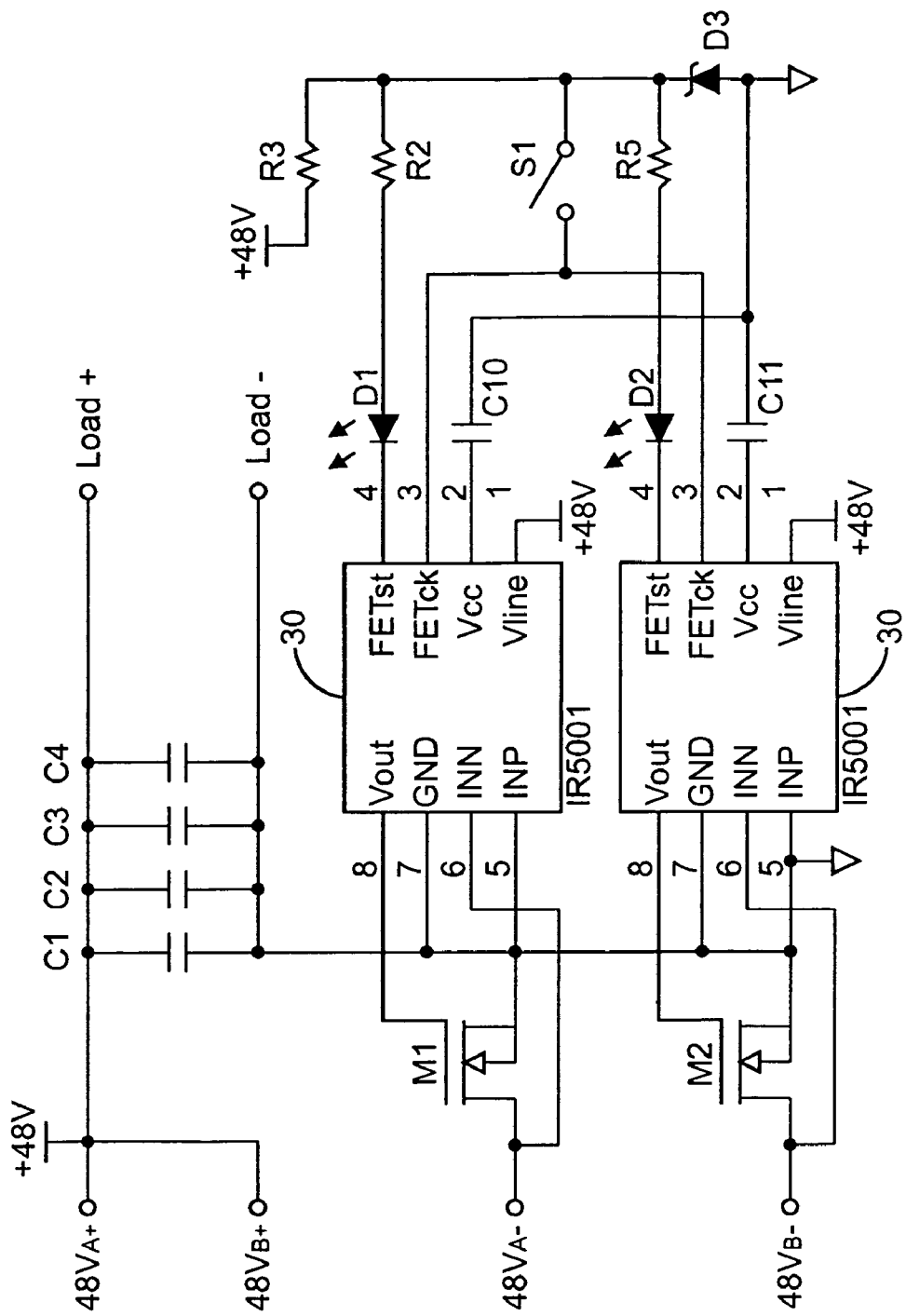
FIG. 6 shows a redundant power system utilizing the controller of FIG. 5.

The controller has a substantial hysteresis voltage to resist steady state oscillation. For example, the two threshold voltages may be 23 mV and −5 mV, which indicates a 28 mV hysteresis voltage. When the input voltage ($V_{in+}-V_{in-}$) is over 23 mV, the controller sets the output to high. This high output signal is used to turn on a corresponding power MOSFET M1 or M2 (FIG. 6). After the turn-on of the power MOSFET, the input voltage ($V_{in+}-V_{in-}$) will be decreased. However, the polarity of the input voltage ($V_{in+}-V_{in-}$) will not change to negative, or below zero. Therefore, the controller will not set the output from high to low after it sets the output from low to high, which prevents a steady state oscillation.

An asymmetrical propagation delay time design makes the controller immune to noise in the application circuit. The propagation delay time to drive the output from high to low is very small. The typical delay time is 50 ns with 10 nF as a load. On the other hand, the propagation delay time to drive the output from low to high is very long. This typical delay time is 3 ms, which is about sixty thousand times the delay to set the output from high to low. Therefore, it takes a much longer time to set the output from low to high than to set the output from high to low, which improves the controller's noise immunity. For example, at the inputs ($V_{in+}-V_{in-}$), assume there is a pulse signal from −50 mV to +50 mV with 50% duty cycle and less than 1 ms pulse width. The output voltage will be always at logic low because the period of 1 ms is not long enough to deliver the logic signal from input to output to drive the output from low to high, while the period of 1 ms is long enough to deliver the logic signal to drive the output from high to low. Therefore, this active ORing controller will keep its output low without any oscillation if any noise with less than 1 ms pulse width appears at its inputs, which improves the controller's dynamic noise immunity.

The ORing controller has an FET check (FET_ck) pin to set the output OUT to low when the FET_ck pin voltage is at logic high. This feature makes a live check of status of the power MOSFETs.

An FET status (FET_st) pin is used to show the status of the power MOSFET (not shown). Whenever the input voltage (($V_{in+}-V_{in-}$) is less than −0.3V, a MOSFET 40 is controlled by a comparator 50B such that the FET_st pin has a logic low signal and a corresponding LED D1 or D2 is extinguished.

ORing Controller Demo Board

FIG. 6 is a schematic diagram of the demo board. Two 100V N-channel (IRF7495) power MOSFETs M1, M2 used in this circuit are capable of handling up to 200 W of redundant power in the 36V to 75V range. Four 3.3 uF, 80V aluminum capacitors C1–C4 are connected on the redundant bus. The power load can be an electronic load or a resistor. A standard ¼ brick, ⅛ brick, or IR2085S DC Bus Converter demo board can also be used as the load (pin-compatible through-hole solderable connections are provided on the demo board). Two LEDs D1, D2 are used to show the status of the two corresponding power MOSFETs M1, M2. On the demo board, there is a normally-OFF switch S1. When the switch is closed, a logic high signal is applied to both FET_ck pins to turn both power MOSFETs M1, M2 off. Based on the LEDs' on or off status, the power MOSFETs' status is determined.

Live FET Check Function

A simple way to understand the FET check function is to suppose that there is only one power supply. If the power MOSFET is good and conducts current, its Vds voltage drop is very small when it is on, and its LED is off; and its Vds voltage drop is about 0.7V when it is off, and its LED is on. Therefore, information whether the LED is on or off indicates the power MOSFET status.

In a real system, it may not be practical to disconnect one of the two sources. If the voltage of each source cannot be changed, it is not easy to determine if the power MOSFETs work or not. Usually, it is possible to determine if one of the FETs is working properly or not. That MOSFET has to be connected to a higher voltage source. The reason is that the FET has a higher than 300 mV drop on Vds when it is off if it functions correct usually, which turns its LED on during the live checkup. For the FET, which is connected to a source with a relatively low voltage, it is not that straightforward to determine if the FET is good or not. The reason is that the Vds across the FET is determined by the FET and two source voltages. When the FET is short, its Vds will be always less than 300 mV, which turns off its LED. It the FET is not short, the Vds across the FET is based on the difference between the two sources. Usually, a truth table as shown in Table 2, can be applied to determine the status of individual FETs based on various possible status of the sources A and B. Note that this table can determine not only if a FET is short, but also if it is open.

Conclusions

An active ORing controller makes a N-channel power MOSFET work as a diode when it is in reverse. It turns on the N-channel MOSFET when it is in forward, in which its Vds drop is at least ten times smaller than that of Schottky diodes. Its low Vds drop decreases the power loss dramatically. Its offset and hysteresis design prevent it from steady state oscillation. Two different propagation delays improve its dynamic noise immunity. An FET check function can be utilized to provide a live checkup of the power MOSFETs' status to improve the reliability of system power redundancy.

Although the present invention has been described in relation to particular embodiments thereof, many other variations and modifications and other uses will become apparent to those skilled in the art. Therefore, the present invention is not limited by the specific disclosure herein.

TABLE 1

Power loss estimation for ORing devices

| | ORing devices | | |
|---|---|---|---|
| | 16CTQ100S | 63CTQ100S | IRF7495 |
| Package | D2-Pak | D2-Pak | SO8 |
| Vdrop @ 4A | 600 mV | 370 mV | ~85 mV |
| Power Loss | 2.4 W | 1.48 W | 0.37 W |

TABLE 2

Truth table for IR5001 "FET Check Feature"

| Case | LED | Initial | During the check | | FET A | FET B | Comments |
|---|---|---|---|---|---|---|---|
| 1 | A | Off | On | Vsd of FET A > 0.3 V | Good | N/A | VA > VB + 0.4 V |
|   | B | Off | Off | Vsd of FET B < 0.3 V |  |  |  |
| 2 | A | Off | On | Vsd of FET A > 0.3 V | Good | Good | IVA – VBI < 0.4 V |
|   | B | Off | On | Vsd of FET B > 0.3 V |  |  |  |
| 3 | A | Off | Off | Vsd of FET A < 0.3 V | Short | N/A | VA > VB + 0.3 V |
|   | B | Off | Off | Vsd of FET B < 0.3 V | At least one is short |  | IVA – VBI < 0.3 V |
|   |   |   |   |   | N/A | Short | VB > VA + 0.3 V |
| 4 | A | On | On | Vsd of FET A > 0.3 V | Open or diode | Good | VA > VB + 0.3 V |
|   | B | Off | On | Vsd of FET B > 0.3 V |  |  |  |
| 5 | A | On | On | Vsd of FET A > 0.3 V | Open | Short | VA > VB + 0.3 V |
|   | B | Off | Off | Vsd of FET B < 0.3 V | Diode | N/A | IVA – VBI < 0.4 V |
| 6 | A | On |   |   | Open or diode |  |  |

Note:
VA, VB are two sources, which connected with FET A and FET B, respectively. LED A and LED B are LEDs corresponding to FET A and FET B.

What is claimed is:

1. A redundant power system including an active ORing controller and a power MOSFET;
   said redundant power system having a power input terminal and a power output terminal for providing a current to a load;
   said power MOSFET carrying substantially the entire said current, the controller comprising:
   a comparator circuit for detecting a voltage difference across first and second main terminals of a power MOSFET, and comparing said voltage difference against a first predetermined level; and
   a control circuit which receives an output of said comparator circuit and outputs a control signal to be applied to a gate terminal of said power MOSFET;
   said control signal having a value so as to turn said power MOSFET OFF in response to said voltage difference falling below said predetermined level, and to turn said power MOSFET ON at other times.

2. The controller of claim 1, wherein said predetermined level is defined by two threshold voltages with positive and negative polarities, respectively.

3. The controller of claim 2, wherein said negative threshold voltage is smaller in absolute value than said positive threshold voltage.

4. An active ORing controller for controlling a power MOSFET in a redundant power system, the controller comprising:
   a comparator circuit for detecting a voltage difference across first and second main terminals of a power MOSFET, and comparing said voltage difference against a first predetermined level; and
   a control circuit which receives an output of said comparator circuit and outputs a control signal to be applied to a gate terminal of said power MOSFET;
   said control signal having a value so as to turn said power MOSFET OFF in response to said voltage difference falling below said predetermined level, and to turn said power MOSFET ON at other times;
   wherein said control circuit turns said power MOSFET ON and OFF with a turn-on delay and a turn-off delay that are unequal.

5. The controller of claim 4, wherein said turn-on delay is greater than said turn-off delay.

6. The controller of claim 5, wherein said control circuit comprises one or more diodes carrying said control signal for increasing said turn-on delay.

7. An active ORing controller for controlling a power MOSFET in a redundant power system, the controller comprising:
   a comparator circuit for detecting a voltage difference across first and second main terminals of a power MOSFET, and comparing said voltage difference against a first predetermined level; and
   a control circuit which receives an output of said comparator circuit and outputs a control signal to be applied to a gate terminal of said power MOSFET;
   said control signal having a value so as to turn said power MOSFET OFF in response to said voltage difference falling below said predetermined level, and to turn said power MOSFET ON at other times further comprising:
   a check circuit which is operable for setting said control signal to turn said power MOSFET OFF; and
   a sense circuit for detecting whether said voltage difference is lower than a second predetermined level, and if so, giving an indication that said power MOSFET is defective.

8. The controller of claim 7, wherein said sense circuit comprises a comparator, a MOSFET and an LED; and
   wherein said comparator controls said MOSFET to extinguish said LED when said voltage difference is lower than said second predetermined level, and to illuminate said LED at other times.

9. A redundant power system including an integrated active ORing controller and a power MOSFET;
   said redundant power system having a power input terminal and a power output terminal for providing a current to a load;
   said power MOSFET carrying substantially the entire said current, the controller comprising a package, circuits within the package and terminals extending out of the package, said controller comprising:
   a comparator circuit having a pair of voltage inputs for receiving and detecting a voltage difference across first and second main terminals of a power MOSFET, respectively, and comparing said voltage difference against a first predetermined level; and a control circuit which receives an output of said comparator circuit and outputs a control signal at a voltage output terminal to be applied to a gate terminal of said power MOSFET;

said control signal having a value so as to turn said power MOSFET OFF in response to said voltage difference falling below said predetermined level, and to turn said power MOSFET ON at other times.

10. An integrated active ORing controller for controlling a power MOSFET in a redundant power system, the controller comprising a package, circuits within the package and terminals extending out of the package, said controller comprising:

a comparator circuit having a pair of voltage inputs for receiving and detecting a voltage difference across first and second main terminals of a power MOSFET, respectively, and comparing said voltage difference against a first predetermined level; and a control circuit which receives an output of said comparator circuit and outputs a control signal at a voltage output terminal to be applied to a gate terminal of said power MOSFET;

said control signal having a value so as to turn said power MOSFET OFF in response to said voltage difference falling below said predetermined level, and to turn said power MOSFET ON at other times; and further comprising:

a check circuit which is operable for receiving a check signal at a check terminal, and in response thereto, setting said control signal to turn said power MOSFET OFF; and a sense circuit for detecting whether said voltage difference is lower than a second predetermined level, and if so, giving an indication at a status terminal that said power MOSFET is defective.

11. The integrated controller of claim 10, further comprising:

a line voltage input terminal;

an internal regulator connected to said line voltage and supplying a regulated output voltage to an internal bus, said internal bus being connected to an internal bus terminal;

and a ground terminal.

12. The integrated controller of claim 11, further comprising a capacitor connected between said internal bus terminal and said ground terminal.

13. The integrated controller of claim 7, further comprising:

a line voltage input terminal;

an internal regulator connected to said line voltage and supplying a regulated output voltage to an internal bus, said internal bus being connected to an internal bus terminal;

and a ground terminal.

14. The integrated controller of claim 13, further comprising a capacitor connected between said internal bus terminal and said ground terminal.

15. The controller of claim 9, wherein said predetermined level is defined by two threshold voltages with positive and negative polarities, respectively.

16. The controller of claim 15, wherein said negative threshold voltage is smaller in absolute value than said positive threshold voltage.

17. The controller of claim 9, wherein said control circuit turns said power MOSFET ON and OFF with a turn-on delay and a turn-off delay that are unequal.

18. The controller of claim 17, wherein said turn-on delay is greater than said turn-off delay.

19. The controller of claim 18, wherein said control circuit comprises one or more diodes carrying said control signal for increasing said turn-on delay.

20. The controller of claim 10, wherein said sense circuit comprises a comparator, a MOSFET and an LED; and wherein said comparator controls said MOSFET to extinguish said LED when said voltage difference is lower than said second predetermined level, and to illuminate said LED at other times.

* * * * *